US010804243B2

(12) United States Patent
Kelly et al.

(10) Patent No.: US 10,804,243 B2
(45) Date of Patent: *Oct. 13, 2020

(54) DUAL-SIDED MEMORY MODULE WITH CHANNELS ALIGNED IN OPPOSITION

(71) Applicant: Apple Inc., Cupertino, CA (US)

(72) Inventors: James D. Kelly, Scotts Valley, CA (US); William H. Radke, Los Gatos, CA (US); Steven J. Sfarzo, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/243,563

(22) Filed: Jan. 9, 2019

(65) Prior Publication Data

US 2019/0198480 A1 Jun. 27, 2019

Related U.S. Application Data

(63) Continuation of application No. 15/817,066, filed on Nov. 17, 2017, now Pat. No. 10,217,721.

(Continued)

(51) Int. Cl.

*H05K 7/10* (2006.01)
*H01L 25/065* (2006.01)

(Continued)

(52) U.S. Cl.

CPC ............ *H01L 25/0652* (2013.01); *G11C 5/04* (2013.01); *G11C 5/066* (2013.01); *H01L 23/5386* (2013.01); *H01L 24/16* (2013.01); *G11C 11/417* (2013.01); *H01L 23/5384* (2013.01); *H01L 25/105* (2013.01); *H01L 2224/16227* (2013.01); *H01L 2225/06517* (2013.01);

(Continued)

(58) Field of Classification Search

CPC . H01L 25/0652; H01L 23/5386; H01L 24/16; H01L 2225/06572; G11C 5/066; G11C 5/04; H05K 1/0243

USPC .......................................................... 361/767

See application file for complete search history.

(56) References Cited

U.S. PATENT DOCUMENTS 6,594,167 B1 7/2003 Yamasaki
6,943,454 B1 * 9/2005 Gulachenski ............ G11C 5/02 257/777

(Continued)

FOREIGN PATENT DOCUMENTS

CN 101017701 8/2007

OTHER PUBLICATIONS

PCT International Search Report and Written Opinion for International Application No. PCT/US2018/028387, dated Jul. 18, 2018, 11 pages.

(Continued)

*Primary Examiner* — Jarrett J Stark
(74) *Attorney, Agent, or Firm* — Jaffery Watson Mendonsa & Hamilton LLP

(57) ABSTRACT

Memory packages, memory modules, and circuit boards are described. In an embodiment, single channel memory packages are mounted on opposite sides of a circuit board designed with a first side also designed to accept dual channel memory packages. Alternatively, dual channel memory packages may be mounted on a first side of a circuit board that is also designed to accept single channel packages on opposite sides.

16 Claims, 15 Drawing Sheets

Related U.S. Application Data

(60) Provisional application No. 62/502,554, filed on May 5, 2017.

(51) Int. Cl.

| | |
|---|---|
| ***H01L 23/00*** | (2006.01) |
| ***H01L 23/538*** | (2006.01) |
| ***G11C 5/04*** | (2006.01) |
| ***G11C 5/06*** | (2006.01) |
| *G11C 11/417* | (2006.01) |
| *H01L 25/10* | (2006.01) |
| *H05K 1/02* | (2006.01) |

(52) U.S. Cl.

CPC ............... *H01L 2225/06558* (2013.01); *H01L 2225/06572* (2013.01); *H01L 2924/14361* (2013.01); *H05K 1/0243* (2013.01)

(56) References Cited

U.S. PATENT DOCUMENTS

| | | | | |
|---|---|---|---|---|
| 7,411,806 | B2 | 8/2008 | Funaba et al. | |
| 8,228,679 | B2 * | 7/2012 | Shilling | H01L 23/50 174/260 |
| 8,254,155 | B1 | 8/2012 | Crisp et al. | |
| 9,117,496 | B2 | 8/2015 | Shaeffer et al. | |
| 2004/0071040 | A1 | 4/2004 | Funaba | |
| 2005/0195629 | A1 | 9/2005 | Leddige | |
| 2006/0049500 | A1 | 3/2006 | Goodwin | |
| 2006/0049512 | A1 | 3/2006 | Goodwin | |
| 2006/0267172 | A1 | 11/2006 | Nguyen | |
| 2009/0154212 | A1 | 6/2009 | Park | |
| 2013/0193582 | A1 | 8/2013 | Choi | |
| 2013/0258755 | A1 | 10/2013 | Kollipara | |
| 2013/0314068 | A1 | 11/2013 | Shaeffer | |
| 2013/0314968 | A1 | 11/2013 | Shaeffer | |
| 2014/0131895 | A1 | 5/2014 | Song | |
| 2014/0268973 | A1 | 9/2014 | Connolly | |
| 2016/0093339 | A1 | 1/2016 | Crisp | |

OTHER PUBLICATIONS

PCT Invitation to Correct Defects for International Application No. PCT/US2018/028387, dated May 3, 2018, 2 pages.

Malladi, et al., "Towards Energy-Proportional Datacenter Memory with Mobile DRAM," International Symposium on Computer 2012, 12 pgs. Architecturehttp://csi.stanford.edu/~christos/publications/2012.lpddr2.isca.pdf.

* cited by examiner

ELECTRICALLY FUNCTIONAL TERMINALS 304

ADDED TERMINALS 304A

310

| | 1 | 2 | 3 | 4 | 5 | 6 | 7 | 8 | 9 | 10 | 11 | 12 |
|---|---|---|---|---|---|---|---|---|---|---|---|---|
| A | DNU | DNU | VSS | VDD2 | ZQ0 | | | ZQ1 | VDD2 | VSS | DNU | DNU |
| B | DNU | DQ0_A | VDDQ | DQ7_A | VDDQ | | ZQ3 | VDDQ | DQ15_A | VDDQ | DQ8_A | DNU |
| C | VSS | DQ1_A | DMI0_A | DQ6_A | VSS | | | VSS | DQ14_A | DMI1_A | DQ9_A | VSS |
| D | VDDQ | VSS | DQS0_t_A | VSS | VDDQ | | | VDDQ | VSS | DQS1_t_A | VSS | VDDQ |
| E | VSS | DQ2_A | DQS0_c_A | DQ5_A | VSS | | | VSS | DQ13_A | DQS1_c_A | DQ10_A | VSS |
| F | VDD1 | DQ3_A | VDDQ | DQ4_A | VDD2 | | | VDD2 | DQ12_A | VDDQ | DQ11_A | VDD1 |
| G | VSS | ODT_CA_A | VSS | VDD1 | VSS | CKE3_A | | VSS | VDD1 | VSS | ZQ2 | VSS |
| H | VDD2 | CA0_A | CS1_A | CS0_A | VDD2 | | | VDD2 | CA2_A | CA3_A | CA4_A | VDD2 |
| J | VSS | CA1_A | VSS | CKE0_A | CKE1_A | | CS3_A | CK_t_A | CK_c_A | VSS | CA5_A | VSS |
| K | VDD2 | VSS | VDD2 | VSS | CS2_A | | | CKE2_A | VSS | VDD2 | VSS | VDD2 |
| L | | | | | | | | | | | | |
| M | | | | | | | | | | | | |
| N | VDD2 | VSS | VDD2 | VSS | CS2_B | | | CKE2_B | VSS | VDD2 | VSS | VDD2 |
| P | VSS | CA1_B | VSS | CKE0_B | CKE1_B | | | CK_t_B | CK_c_B | VSS | CA5_B | VSS |
| R | VDD2 | CA0_B | CS1_B | CS0_B | VDD2 | | | VDD2 | CA2_B | CA3_B | CA4_B | VDD2 |
| T | VSS | ODT_CA_B | VSS | VDD1 | VSS | | | VSS | VDD1 | VSS | RESET_N | VSS |
| U | VDD1 | DQ3_B | VDDQ | DQ4_B | VDD2 | | | VDD2 | DQ12_B | VDDQ | DQ11_B | VDD1 |
| V | VSS | DQ2_B | DQS0_c_B | DQ5_B | VSS | | | VSS | DQ13_B | DQS1_c_B | DQ10_B | VSS |
| W | VDDQ | VSS | DQS0_t_B | VSS | VDDQ | | | VDDQ | VSS | DQS1_t_B | VSS | VDDQ |
| Y | VSS | DQ1_B | DMI0_B | DQ6_B | VSS | | | VSS | DQ14_B | DMI1_B | DQ9_B | VSS |
| AA | DNU | DQ0_B | VDDQ | DQ7_B | VDDQ | | | VDDQ | DQ15_B | VDDQ | DQ8_B | DNU |
| AB | DNU | DNU | VSS | VDD2 | VSS | | | VSS | VDD2 | VSS | DNU | DNU |

ADDED TERMINALS 304A

304A ADDED TERMINALS

320

300

DE-FUNCTIONALIZED 304B TERMINALS

DE-FUNCTIONALIZED 304B TERMINALS

FIG. 4A

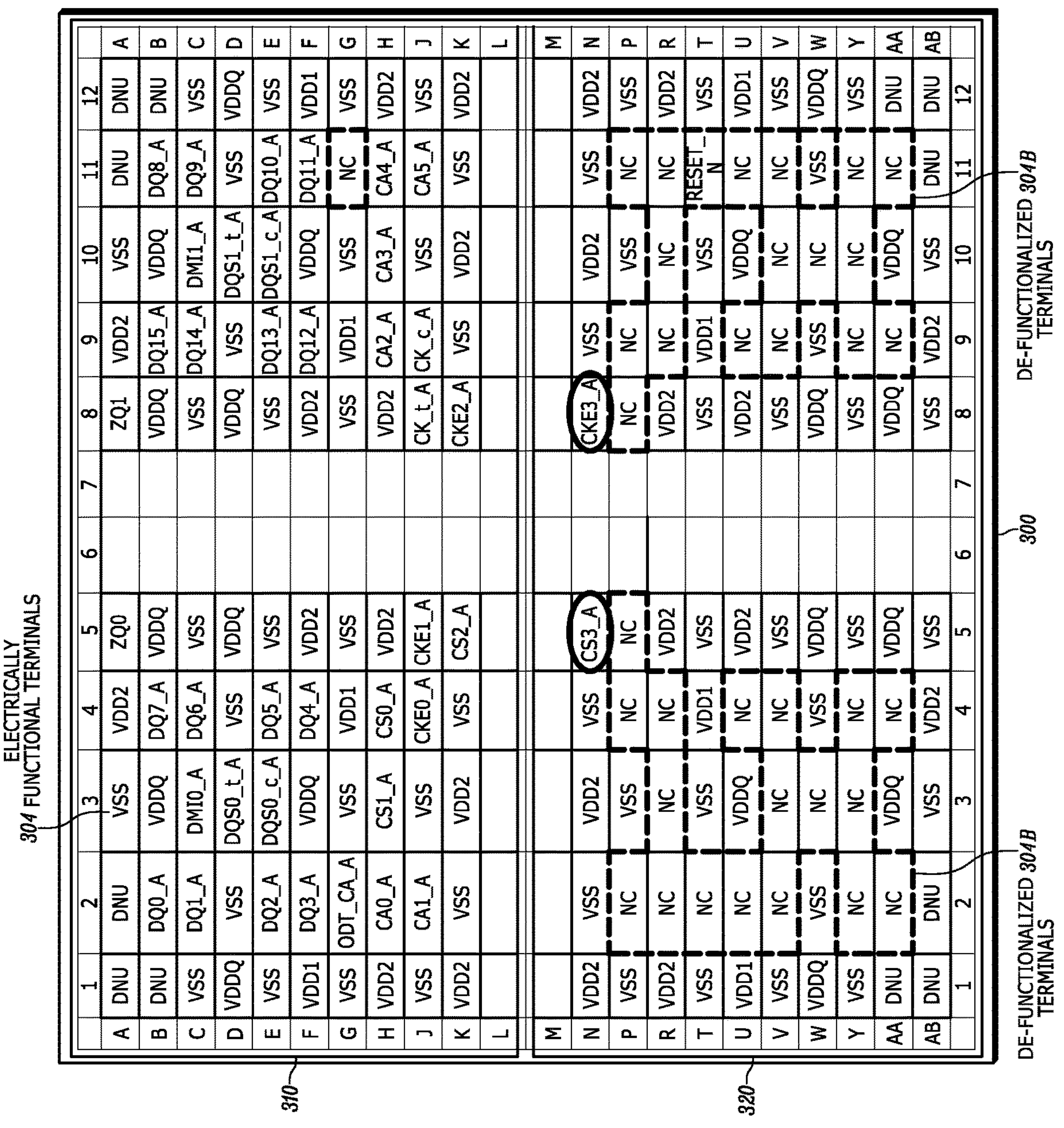

| | 1 | 2 | 3 | 4 | 5 | 6 | 7 | 8 | 9 | 10 | 11 | 12 |
|---|---|---|---|---|---|---|---|---|---|---|---|---|
| A | DNU | DNU | VSS | VDD2 | ZQ0 | | | ZQ1 | VDD2 | VSS | DNU | DNU |
| B | DNU | DQ0_A | VDDQ | DQ7_A | VDDQ | | | VDDQ | DQ15_A | VDDQ | DQ8_A | DNU |
| C | VSS | DQ1_A | DMI0_A | DQ6_A | VSS | | | VSS | DQ14_A | DMI1_A | DQ9_A | VSS |
| D | VDDQ | VSS | DQS0_t_A | VSS | VDDQ | | | VDDQ | VSS | DQS1_t_A | VSS | VDDQ |
| E | VSS | DQ2_A | DQS0_c_A | DQ5_A | VSS | | | VSS | DQ13_A | DQS1_c_A | DQ10_A | VSS |
| F | VDD1 | DQ3_A | VDDQ | DQ4_A | VDD2 | | | VDD2 | DQ12_A | VDDQ | DQ11_A | VDD1 |
| G | VSS | ODT_CA_A | VSS | VDD1 | VSS | | | VSS | VDD1 | VSS | NC | VSS |
| H | VDD2 | CA0_A | CS1_A | CS0_A | VDD2 | | | VDD2 | CA2_A | CA3_A | CA4_A | VDD2 |
| J | VSS | CA1_A | VSS | CKE0_A | CKE1_A | | | CK_t_A | CK_c_A | VSS | CA5_A | VSS |
| K | VDD2 | VSS | VDD2 | VSS | CS2_A | | | CKE2_A | VSS | VDD2 | VSS | VDD2 |
| L | | | | | | | | | | | | |
| M | | | | | | | | | | | | |
| N | VDD2 | VSS | VDD2 | VSS | CS3_A | | | CKE3_A | VSS | VDD2 | VSS | VDD2 |
| P | VSS | NC | VSS | NC | NC | | | NC | NC | VSS | NC | VSS |
| R | VDD2 | NC | NC | NC | VDD2 | | | VDD2 | NC | NC | NC | VDD2 |
| T | VSS | NC | VSS | VDD1 | VSS | | | VSS | VDD1 | VSS | RESET_N | VSS |
| U | VDD1 | NC | VDDQ | NC | VDD2 | | | VDD2 | NC | VDDQ | NC | VDD1 |
| V | VSS | NC | NC | NC | VSS | | | VSS | NC | NC | NC | VSS |
| W | VDDQ | VSS | NC | VSS | VDDQ | | | VDDQ | VSS | NC | VSS | VDDQ |
| Y | VSS | NC | NC | NC | VSS | | | VSS | NC | NC | NC | VSS |
| AA | DNU | NC | VDDQ | NC | VDDQ | | | VDDQ | NC | VDDQ | NC | DNU |
| AB | DNU | DNU | VSS | VDD2 | VSS | | | VSS | VDD2 | VSS | DNU | DNU |

| | 1 | 2 | 3 | 4 | 5 | 6 | 7 | 8 | 9 | 10 | 11 | 12 |
|---|---|---|---|---|---|---|---|---|---|---|---|---|
| A | DNU | DNU | VSS | VDD2 | VSS | | | VSS | VDD2 | VSS | DNU | DNU |
| B | DNU | | VDDQ | | VDDQ | | | VDDQ | | VDDQ | | DNU |
| C | VSS | | | | VSS | | | VSS | | | | VSS |
| D | VDDQ | VSS | | VSS | VDDQ | | | VDDQ | VSS | | VSS | VDDQ |
| E | VSS | | | | VSS | | | VSS | | | | VSS |
| F | VDD1 | | VDDQ | | VDD2 | | | VDD2 | | VDDQ | | VDD1 |
| G | VSS | | VSS | VDD1 | VSS | | | VSS | VDD1 | VSS | RESET_N | VSS |
| H | VDD2 | | | | VDD2 | | | VDD2 | | | | VDD2 |
| J | VSS | | VSS | | | | | | | VSS | | VSS |
| K | VDD2 | VSS | VDD2 | VSS | | | | | VSS | VDD2 | VSS | VDD2 |
| L | | | | | | | | | | | | |
| M | | | | | | | | | | | | |
| N | VDD2 | VSS | VDD2 | VSS | CS2_A | | | CKE2_A | VSS | VDD2 | VSS | VDD2 |
| P | VSS | CA1_A | VSS | CKE0_A | CKE1_A | | CS3 | CK_t_A | CK_c_A | VSS | CA5_A | VSS |
| R | VDD2 | CA0_A | CS1_A | CS0_A | VDD2 | | | VDD2 | CA2_A | CA3_A | CA4_A | VDD2 |
| T | VSS | ODT_CA_A | VSS | VDD1 | VSS | CKE3 | | VSS | VDD1 | VSS | ZQ2 | VSS |
| U | VDD1 | DQ3_A | VDDQ | DQ4_A | VDD2 | | | VDD2 | DQ12_A | VDDQ | DQ11_A | VDD1 |
| V | VSS | DQ2_A | DQS0_c_A | DQ5_A | VSS | | | VSS | DQ13_A | DQS1_c_A | DQ10_A | VSS |
| W | VDDQ | VSS | DQS0_t_A | VSS | VDDQ | | | VDDQ | VSS | DQS1_t_A | VSS | VDDQ |
| Y | VSS | DQ1_A | DMI0_A | DQ6_A | VSS | | | VSS | DQ14_A | DMI1_A | DQ9_A | VSS |
| AA | DNU | DQ0_A | VDDQ | DQ7_A | VDDQ | | ZQ3 | VDDQ | DQ15_A | VDDQ | DQ8_A | DNU |
| AB | DNU | DNU | VSS | VDD2 | ZQ0 | | | ZQ1 | VDD2 | VSS | DNU | DNU |

| | 1 | 2 | 3 | 4 | 5 | 6 | 7 | 8 | 9 | 10 | 11 | 12 |
|---|---|---|---|---|---|---|---|---|---|---|---|---|
| A | DNU | DNU | VSS | VDD2 | ZQ0 | | | ZQ1 | VDD2 | VSS | DNU | DNU |
| B | DNU | DQ0_A | VDDQ | DQ7_A | VDDQ | | | VDDQ | DQ15_A | VDDQ | DQ8_A | DNU |
| C | VSS | DQ1_A | DMI0_A | DQ6_A | VSS | | | VSS | DQ14_A | DMI1_A | DQ9_A | VSS |
| D | VDDQ | VSS | DQS0_t_A | VSS | VDDQ | | | VDDQ | VSS | DQS1_t_A | VSS | VDDQ |
| E | VSS | DQ2_A | DQS0_c_A | DQ5_A | VSS | | | VSS | DQ13_A | DQS1_c_A | DQ10_A | VSS |
| F | VDD1 | DQ3_A | VDDQ | DQ4_A | VDD2 | | | VDD2 | DQ12_A | VDDQ | DQ11_A | VDD1 |
| G | VSS | ODT_CA_A | VSS | VDD1 | VSS | | | VSS | VDD1 | VSS | NC | VSS |
| H | VDD2 | CA0_A | CS1_A | CS0_A | VDD2 | | | VDD2 | CA2_A | CA3_A | CA4_A | VDD2 |
| J | VSS | CA1_A | VSS | CKE0_A | CKE1_A | | | CK_t_A | CK_c_A | VSS | CA5_A | VSS |
| K | VDD2 | VSS | VDD2 | VSS | CS2_A | | | CKE2_A | VSS | VDD2 | VSS | VDD2 |
| L | | | | | | | | | | | | |
| M | | | | | | | | | | | | |
| N | VDD2 | VSS | VDD2 | VSS | CS3_A | | | CKE3_A | VSS | VDD2 | VSS | VDD2 |
| P | VSS | CA1_B | VSS | CKE0_B | CKE1_B | | | CK_t_B | CK_c_B | VSS | CA5_B | VSS |
| R | VDD2 | CA0_B | CS1_B | CS0_B | VDD2 | | | VDD2 | CA2_B | CA3_B | CA4_B | VDD2 |
| T | VSS | ODT_CA_B | VSS | VDD1 | VSS | | | VSS | VDD1 | VSS | RESET_N | VSS |
| U | VDD1 | DQ3_B | VDDQ | DQ4_B | VDD2 | | | VDD2 | DQ12_B | VDDQ | DQ11_B | VDD1 |
| V | VSS | DQ2_B | DQS0_c_B | DQ5_B | VSS | | | VSS | DQ13_B | DQS1_c_B | DQ10_B | VSS |
| W | VDDQ | VSS | DQS0_t_B | VSS | VDDQ | | | VDDQ | VSS | DQS1_t_B | VSS | VDDQ |
| Y | VSS | DQ1_B | DMI0_B | DQ6_B | VSS | | | VSS | DQ14_B | DMI1_B | DQ9_B | VSS |
| AA | DNU | DQ0_B | VDDQ | DQ7_B | VDDQ | | | VDDQ | DQ15_B | VDDQ | DQ8_B | DNU |
| AB | DNU | DNU | VSS | VDD2 | VSS | | | VSS | VDD2 | VSS | DNU | DNU |

FIG. 7A

DUAL-SIDED MEMORY MODULE WITH CHANNELS ALIGNED IN OPPOSITION

RELATED APPLICATIONS

This application is a continuation of co-pending U.S. patent application Ser. No. 15/817,066 filed Nov. 17, 2017 which claims the benefit of priority to U.S. Provisional Patent Application No. 62/502,554 filed on May 5, 2017, both of which are incorporated herein by reference.

BACKGROUND

Field

Embodiments described herein relate to memory packages and modules.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, the amount of memory required to operate these devices has increased significantly.

One type of mobile memory that has been widely adopted to store short term data used by applications is low power double data rate random access memory (LPDDR RAM). The most recent generations of LPDDR RAM include LPDDR3 and LPDDR4. Generally, an LPDDR3 standard package may include a single 32-bit channel, and two ranks, while an LPDDR4 standard package may include two 16-bit channels, and two ranks. With each channel being 16-bit, power consumption is reduced and operational speed is increased in the LPDDR4 relative to the LPDDR3. Currently LPDDR RAM is scalable to a memory density ranging from 4 Giga byte (GB) to 32 GB.

SUMMARY

Memory packages, circuit boards, and memory modules are described which may be utilized to expand the amount of memory supported by the circuit boards. In an embodiment, a memory package includes a plurality of memory banks arranged in at least two ranks, a first terminal section including first power terminals and first signal terminals to operate the plurality of memory banks, and a second terminal section including second power terminals to operate the plurality of memory banks. The first terminal section may include a larger number of total electrically functional terminals and total signal terminals than the second terminal section.

In an embodiment, a circuit board has a first side including a first package landing area including a first landing pad section and a second landing pad section, and a second side opposite the first side, the second side including a second package landing area including a third landing pad section opposite the second landing pad section and a fourth landing pad section opposite the first landing pad section. A first plurality of interconnects electrically connect power landing pads contained in the first landing pad section and the fourth landing pad section, and a second plurality of interconnects electrically connect power landing pads and signal landing pads contained in the second landing pad section and the third landing pad section.

In an embodiment, a memory module includes a circuit board, four first packages mounted on a first side of the circuit board, each first package including a separate single channel and four ranks, and four second packages mounted on a second side of the circuit board directly opposite the four first packages, each second package including separate single channel and four ranks.

In an embodiment, a memory module includes a circuit board, a first memory package mounted on a first side of the circuit board and a second memory package mounted on a second side of the circuit board opposite the first side. The first memory package includes a first terminal section including first power terminals and first signal terminals to operate a first plurality of memory banks contained within the first memory package, and a second terminal section including second power terminals to operate the first plurality of memory banks. The second memory package includes a third terminal section including third power terminals and second signal terminals to operate a second plurality of memory banks contained within the second memory package, and a fourth terminal section including fourth power terminals to operate the second plurality of memory banks. In an embodiment, the circuit board additionally includes a section of interconnects that electrically connect the first power terminals with the fourth power terminals, and electrically connect the second power terminals with the third power terminals.

In an embodiment a memory module includes a circuit board, and a memory package. The circuit board includes a first side including a first package landing area including a first landing pad section and a second landing pad section, and a second side opposite the first side, the second side including a second package landing area including a third landing pad section opposite the second landing pad section and a fourth landing pad section opposite the first landing pad section. In addition, the circuit board includes a first plurality of interconnects electrically connecting power landing pads contained in the first landing pad section and the fourth landing pad section, and a second plurality of interconnects electrically connecting power landing pads and signal landing pads contained in the second landing pad section and the third landing pad section. In an embodiment, the memory package is mounted onto the first and second landing pad sections, the memory package includes two ranks, a first channel electrically coupled with the first landing pad section, and a second channel electrically coupled with the second landing pad section.

BRIEF DESCRIPTION OF THE DRAWINGS

FIGS. 4A-4B are schematic illustrations of memory package terminal layouts in accordance with embodiments.

FIG. 6B is a schematic illustration of a package area landing pad layout for a second side of a circuit board in accordance with an embodiment.

FIG. 7A is a schematic illustration of a package area landing pad layout for a first side of a circuit board in accordance with an embodiment.

DETAILED DESCRIPTION

Figure 1:
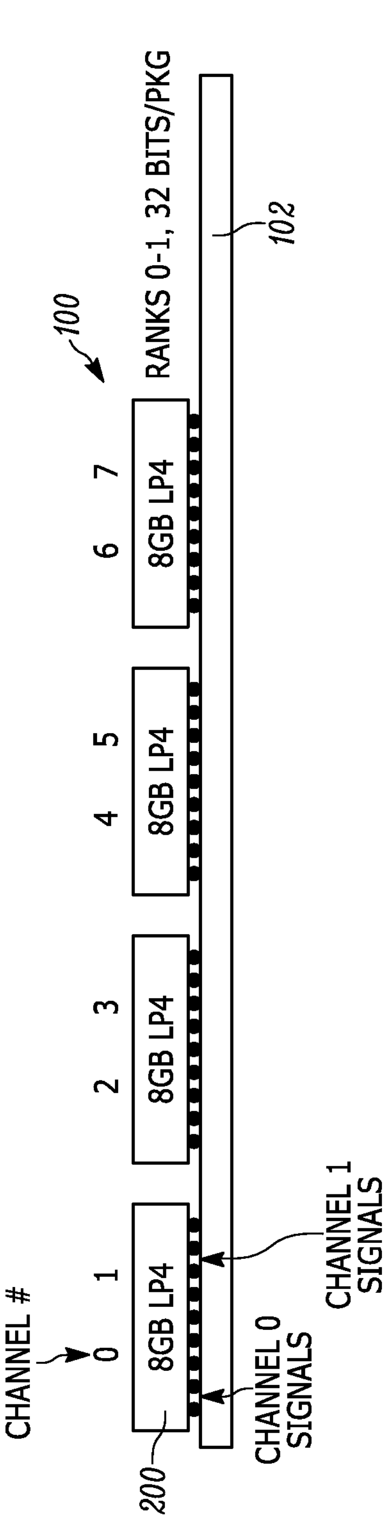
FIG. 1 is a schematic cross-sectional side view illustration of a memory module including four memory packages arranged side-by-side on a circuit board in accordance with an embodiment.

Embodiments describe memory packages, circuit boards, and memory modules which may be utilized to expand the amount of memory supported by the circuit boards. Specifically, embodiments describe memory modules in which a common landing pad pattern is provided on a circuit board for multiple types of memory configurations, while also allowing for dual sided, aligned in opposition, memory package configurations.

In one aspect, embodiments describe particular configurations that may be utilized to increase the available memory on a circuit board. Current memory module proposals to increase memory beyond 32 GB are met with certain tradeoffs in performance. As a starting point, one generally accepted limit for dynamic random-access memory (DRAM) is 8 die per package in order to keep a minimum data speed of 3-4 Gigabits per second (Gbps), for example. In the most recent development from LPDDR3 to LPDDR4, packages were modified from single channel, high bits, to dual channel, lower bits, to increase speed and reduce power consumption, while maintaining the same amount of memory of 8 GB per package and maintaining 8 die per package. Increasing the number of ranks, and additional die within the package, may also be another option for increasing total memory, though this results in an increased capacitive loading on the data lines and speed inversion (effect of decreasing speed for the sake of increasing memory). Additionally, increasing die count beyond 8 die per package may be met with additional manufacturing fallout, for example, where the underlying technology is wire-bond based.

In accordance with embodiments, memory die layouts are described which leverage existing low power die memory based on 8 Gigabits (Gb) in order to scale module memory above 32 GB, such as 64 GB modules. It is to be appreciated however, that while the foundation of embodiments is based on the 8 Gb die, 200-ball 8 GB package, that the scalability is not limited to such systems, and may be applied to a variety of other quantities and layouts.

In one embodiment, the memory module has a capacity of 64 GB. Assuming the feasible limit is 8 dice per package, then the 64 GB system falls out to an 8-landing solution. Further, assume all dice are in byte mode, 64 dice times 8 bits per die is 512 data bits, which fold into 128 physical memory channel bits (e.g. determined by available bus width) resulting in 4 loads per data bit, or alternatively, 4 ranks. In this aspect, embodiments utilize constraints of an 8-landing, 4-rank solution for 64 GB with 8 Gbit die density.

In another aspect, embodiments generally describe the reallocation of bank control within a package, where the number of memory banks (per channel) is increased while the number of data interfaces per package (e.g. channel signals) is decreased. In this manner, the die density and number of banks can be adjusted to achieve a specified memory. Accordingly, embodiments are not limited to 4 ranks or 8 Gbit dice. For example, embodiments may also be utilized with 2 or more ranks. Embodiments may also be utilized with larger die densities such as 16 Gbit dice.

In yet another aspect, in addition to memory module and memory package layouts, embodiments describe circuit boards that may be compatible with conventional package layouts (e.g. conventional 8 GB LPDDR4 packages) as well as higher memory density layouts utilizing the memory packages described herein. Thus, the circuit board layouts may be integrated into existing manufacturing processes, while increasing flexibility of manufacturing processes to support a variety of memory sizes.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", and "on" as used herein may refer to a relative position of one layer with respect to other layers. One layer "over", or "on" another layer or bonded "to" or in "contact" with another layer may be directly in contact with the other layer or may have one or more intervening layers.

FIG. 1 is a schematic cross-sectional side view illustration of a memory module 100 including four memory packages 200 arranged side-by-side on a circuit board 102 in accordance with an embodiment. In accordance with embodiments, the memory packages 200 may be any conventional memory package, such as a commercially available 200-ball 8 GB LPDDR4 package. As shown, the circuit board 102 may be wired to support the 2-channel operation the memory packages 200. The circuit board 102 is described in more detail with regard to FIGS. 5, 6A-6C, and 7A-7C.

Figure 2:
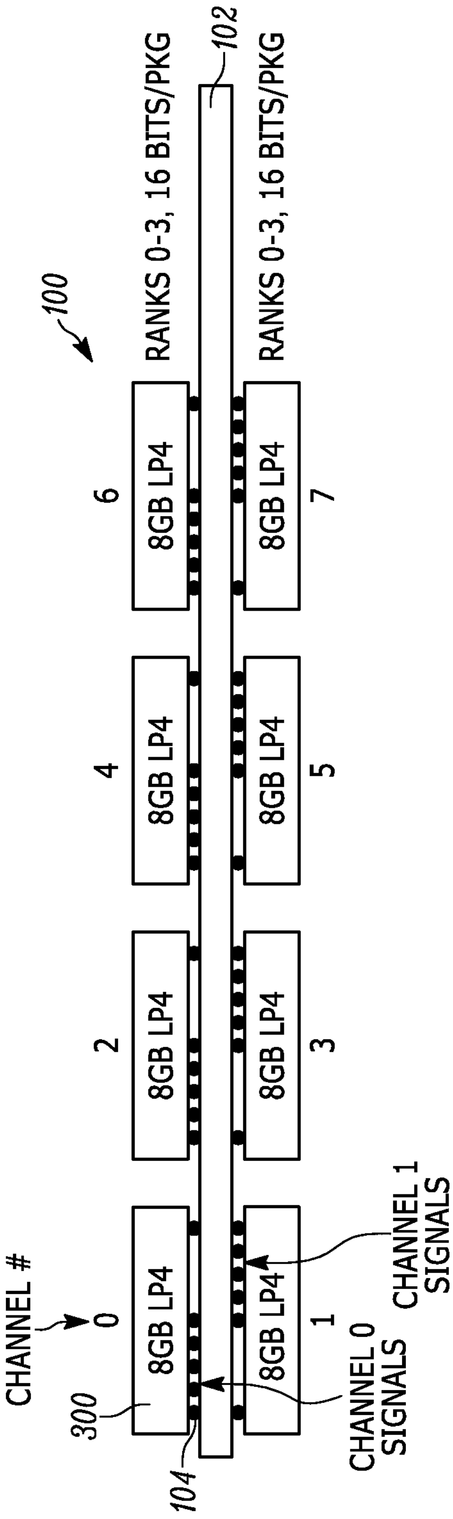
FIG. 2 is a schematic cross-sectional side view illustration of a memory module including a plurality of memory packages mounted on opposite sides of a circuit board in accordance with an embodiment.

Referring now to FIG. 2, a schematic cross-sectional side view illustration is provided of a memory module including a plurality of memory packages mounted on opposite sides of a circuit board in accordance with embodiments. It has been observed that mounting of multiple packages 200 on opposite sides of a circuit board may lead to performance regression due to multiple packages on the bus (signal) leads. In the embodiment illustrated in FIG. 2, rather than adding packages 200 of FIG. 1 on opposite sides of a circuit board (which would effectively have 8 channels and 2 ranks per side), the module illustrated in FIG. 2 has been refactored to include 4 channels and 4 ranks per side of the circuit board 102. The packages 300 have also been refactored. As shown, refactoring may result in a reduced count of electrically functional terminals per package 300, and more specifically reduce the number of signal terminals. Ball count may also be optionally reduced. In the embodiment illustrated in FIG. 2B, solder balls 104 are only shown for active terminals (e.g. pad, bump) for the packages 300. Alternatively, dummy solder balls can be placed at electrically inactive (dummy) terminals, for example, for mechanical integrity.

Figure 3:
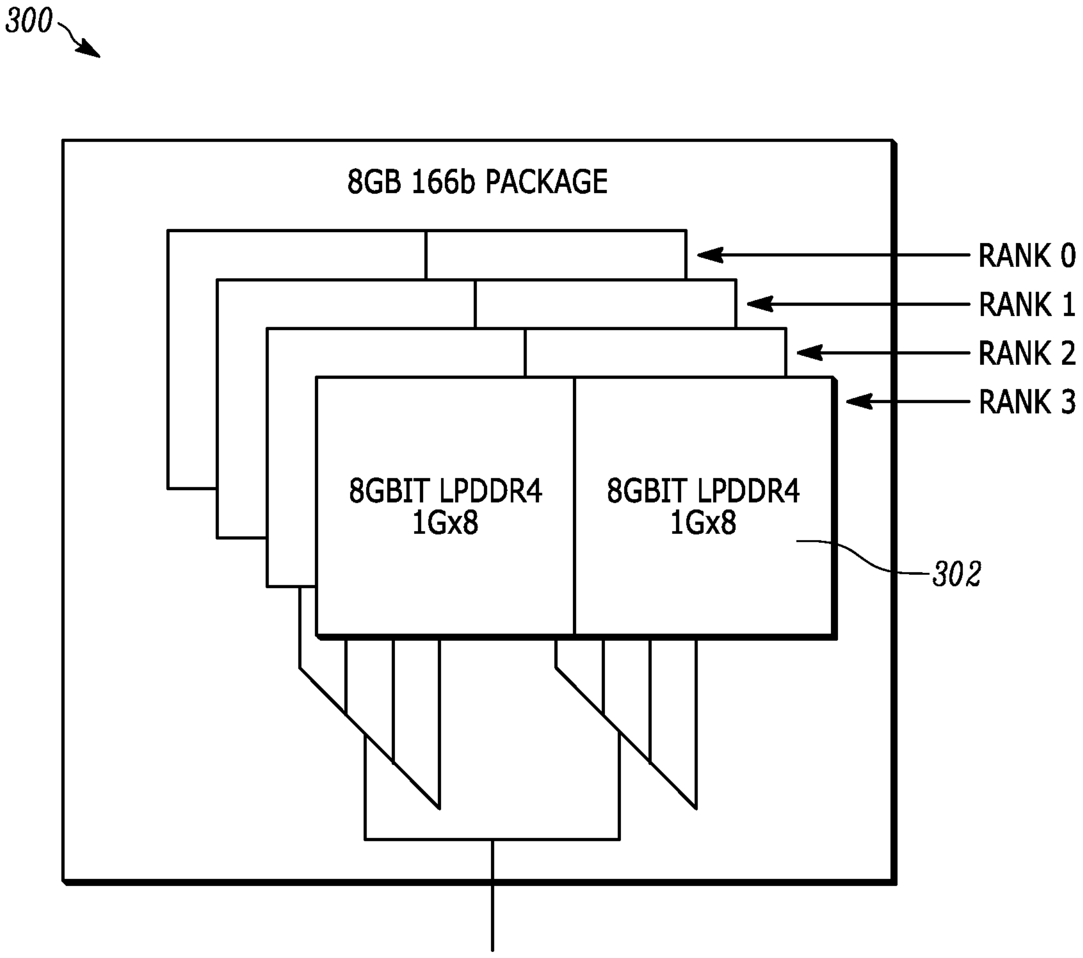
FIG. 3 is a schematic illustration of a die layout within a memory package in accordance with an embodiment.

FIG. 3 is a schematic illustration of a die layout within a memory package 300 in accordance with an embodiment. As described, the memory package 300 may include 8 GB of memory, for example, though the packages 300 may include a different memory density. The particular embodiment illustrated includes 8 dice 302 per package 300, with each die 302 including 8 Gbit of memory. Additionally, the 8 dice are arranged within each package 300 at two dice 302 per rank. A total of four ranks (ranks 0-3) are illustrated, though not required. For example, each package may have two or more ranks, and embodiments are not limited to the specific arrangement and memory density illustrated in FIG. 3.

FIG. 4A is a schematic illustration of a memory package 300 terminal 304 layout in accordance with an embodiment. More specifically, FIG. 4A is an illustration of how a conventional 200-ball 8 GB LPDDR4 package 200 is modified to form a memory package 300 in accordance with embodiments. As shown, three terminals 304A may be additionally added to support the fourth rank (of ranks 0-3), including a 240-ohm calibration reference for rank 3 (ZQ3), channel A clock enable for rank 3 (CKE3_A), and channel A chip select for rank 3 (CS3_A). A complete listing for terminal and corresponding landing pad names and descriptions is provided in Table 1. Additionally, the terminal areas originally reserved for the dual channels in package 200 are now reconfigured as a first section 310 and second section 320. In the embodiment illustrated, the terminals 304B previously corresponding to the signal (e.g. channel select) terminals for Channel B, now within second section 320, have been electrically de-functionalized. For example, the terminals 304B may be depopulated, or disconnected. Depopulated terminals 304B may be nonexistent, while disconnected terminals 304B may have pads that are electrically disconnected. Terminals DNU may be de-functionalized (e.g. dummy terminals) and may be populated with solder balls for mechanical function. While power terminals remain in the second section 320, the reconfigured package 300 is now a single channel (Channel A) package. As will become apparent in the following description, reference to Channel A and Channel B within Table 1 remains consistent when referring to the landing pad arrangements on the circuit board 102, however these terms may instead correspond to first section 310 and second section 320 when referring to the terminals 304 of a single channel memory package 300.

TABLE 1

Lookup Table

| Name | Description |
|---|---|
| CA0_A | Channel A Command/Address bit 0 of [5:0] |
| CA0_B | Channel B Command/Address bit 0 of [5:0] |
| CA1_A | Channel A Command/Address bit 1 of [5:0] |
| CA1_B | Channel B Command/Address bit 1 of [5:0] |
| CA2_A | Channel A Command/Address bit 2 of [5:0] |
| CA2_B | Channel B Command/Address bit 2 of [5:0] |
| CA3_A | Channel A Command/Address bit 3 of [5:0] |
| CA3_B | Channel B Command/Address bit 3 of [5:0] |
| CA4_A | Channel A Command/Address bit 4 of [5:0] |
| CA4_B | Channel B Command/Address bit 4 of [5:0] |
| CA5_A | Channel A Command/Address bit 5 of [5:0] |
| CA5_B | Channel B Command/Address bit 5 of [5:0] |
| CK_c_A | Channel A clock (differential: c = "complement") |
| CK_c_B | Channel B clock (differential: c = "complement") |
| CK_t_A | Channel A clock (differential: t = "true") |
| CK_t_B | Channel B clock (differential: t = "true") |
| CKE0_A | Channel A clock enable for rank 0 |
| CKE0_B | Channel B clock enable for rank 0 |
| CKE1_A | Channel A clock enable for rank 1 |
| CKE1_B | Channel B clock enable for rank 1 |
| CKE2_A | Channel A clock enable for rank 2 |
| CKE2_B | Channel B clock enable for rank 2 |
| CKE3_A | Channel A clock enable for rank 3 |
| CS0_A | Channel A chip select for rank 0 |
| CS0_B | Channel B chip select for rank 0 |
| CS1_A | Channel A chip select for rank 1 |
| CS1_B | Channel B chip select for rank 1 |
| CS2_A | Channel A chip select for rank 2 |

TABLE 1-continued

| Lookup Table | |
|---|---|
| Name | Description |
| CS2_B | Channel B chip select for rank 2 |
| CS3_A | Channel A chip select for rank 3 |
| DMI0_A | Channel A data mask/invert for byte 0 |
| DMI0_B | Channel B data mask/invert for byte 0 |
| DMI1_A | Channel A data mask/invert for byte 1 |
| DMI1_B | Channel B data mask/invert for byte 1 |
| DNU | Do Not Use (mechanical ball only) |
| DQ0_A | Channel A data bit 0 of [l5:0] |
| DQ0_B | Channel B data bit 0 of [15:0] |
| DQ1_A | Channel A data bit 1 of [15:0] |
| DQ1_B | Channel B data bit 1 of [15:0] |
| DQ10_A | Channel A data bit 10 of [15:0] |
| DQ10_B | Channel B data bit 10 of [15:0] |
| DQ11_A | Channel A data bit 11 of [15:0] |
| DQ11_B | Channel B data bit 11 of [15:0] |
| DQ12_A | Channel A data bit 12 of [15:0] |
| DQ12_B | Channel B data bit 12 of [15:0] |
| DQ13_A | Channel A data bit 13 of [15:0] |
| DQ13_B | Channel B data bit 13 of [15:0] |
| DQ14_A | Channel A data bit 14 of [15:0] |
| DQ14_B | Channel B data bit 14 of [15:0] |
| DQ15_A | Channel A data bit 15 of [15:0] |
| DQ15_B | Channel B data bit 15 of [15:0] |
| DQ2_A | Channel A data bit 2 of [15:0] |
| DQ2_B | Channel B data bit 2 of [15:0] |
| DQ3_A | Channel A data bit 3 of [15:0] |
| DQ3_B | Channel B data bit 3 of [15:0] |
| DQ4_A | Channel A data bit 4 of [15:0] |
| DQ4_B | Channel B data bit 4 of [15:0] |
| DQ5_A | Channel A data bit 5 of [15:0] |
| DQ5_B | Channel B data bit 5 of [15:0] |
| DQ6_A | Channel A data bit 6 of [15:0] |
| DQ6_B | Channel B data bit 6 of [15:0] |
| DQ7_A | Channel A data bit 7 of [15:0] |
| DQ7_B | Channel B data bit 7 of [15:0] |
| DQ8_A | Channel A data bit 8 of [15:0] |
| DQ8_B | Channel B data bit 8 of [15:0] |
| DQ9_A | Channel A data bit 9 of [15:0] |
| DQ9_B | Channel B data bit 9 of [15:0] |
| DQS0_c_A | Channel A data strobe for byte 0 (differential: c = "complement") |
| DQS0_c_B | Channel B data strobe for byte 0 (differential: c = "complement") |
| DQS0_t_A | Channel A data strobe for byte 0 (differential: t = "true") |
| DQS0_t_B | Channel B data strobe for byte 0 (differential: t = "true") |
| DQS1_c_A | Channel A data strobe for byte 1 (differential: c = "complement") |
| DQS1_c_B | Channel B data strobe for byte 1 (differential: c = "complement") |
| DQS1_t_A | Channel A data strobe for byte 1 (differential: t = "true") |
| DQS1_t_B | Channel B data strobe for byte 1 (differential: t = "true") |
| NC | No connection (mechanical ball option) |
| ODT_CA_A | Channel A on-die termination enable for command/address |
| ODT_CA_B | Channel B on-die termination enable for command/address |
| RESET_N | Global reset |
| VDD1 | 1.8 V core power |
| VDD2 | 1.1 V core power |
| VDDQ | 0.6 V I/O power |
| VSS | Ground |
| ZQ0 | 240-ohm calibration reference for rank 0 (both channels) |
| ZQ1 | 240-ohm calibration reference for rank 1 (both channels) |
| ZQ2 | 240-ohm calibration reference for rank 2 (both channels) |
| ZQ3 | 240-ohm calibration reference for rank 3 (both channels) |

In accordance with embodiments, a memory package 300 may include a plurality of memory banks arranged in two or more ranks. For example, the memory banks may be contained within a plurality of dice 302. In a specific embodiment, the memory packages 300 include four ranks. A first terminal section 310 of the memory package includes first power terminals (e.g. VDD, VSS) and first signal terminals (e.g. CA, CK, CKE, CS, DQ, DQS) to operate the plurality of memory banks, and a second terminal section 320 includes second power terminals (e.g. VDD, VSS) to operate the plurality of memory banks. As shown in FIG. 4A, the second signal terminals (e.g. CA, CK, CKE, CS, DQ, DQS) have been de-functionalized. In accordance with embodiments, the first terminal section 310 includes a larger number of total electrically functional terminals 304 and total signal terminals than the second terminal section 320. For example, the second terminal section 320 may not include second signal terminals (e.g. CA, CK, CKE, CS, DQ, DQS) to operate the plurality of memory banks.

In accordance with embodiments, the first signal terminals comprise a single channel (e.g. Channel A) for the memory package 300, while the second signal terminals (corresponding to Channel B) have been de-functionalized. In an embodiment, the single channel is a 16 bit channel.

The plurality of memory banks within the memory package may provide 8 GB of memory, with the plurality of memory banks being formed of eight 8 Gb die, with two 8 Gb die per rank. Another exemplary embodiment may utilize eight 16 Gb die, with two 16 Gb die per rank.

In accordance with embodiments, the memory packages 300 may including terminal arrangements for mounting on opposite sides of the circuit board. In an embodiment, the second terminal section 320 is a substantial mirror image of the first terminal section, less the first signal terminals (i.e. the second signal terminals corresponding to Channel B have been de-functionalized). The first section 310 may also include several additional terminals that are not included in the substantial mirror image second terminal section 320, such as a clock enable terminal (CKE3_A), chip select terminal (CS3_A), and calibration terminal (ZQ3).

Referring now to FIG. 4B another embodiment is illustrated showing how a conventional 200-ball 8 GB LPDDR4 package 200 may be modified to form a memory package 300 in accordance with embodiments. Similar to FIG. 4A, the terminal areas originally reserved for the dual channels in package 200 are reconfigured as a first section 310 and second section 320. As shown, rather than create added terminals 304A as provided in FIG. 4A, several terminals 304 in the embodiment illustrated in FIG. 4B are retasked. Specifically, the CS2_B terminal at location N5 is retasked to signal CS3_A, and the CKE2_B terminal at location N8 is retasked to signal CKE3_A. Thus, the Channel B Rank 2 signals are retasked as Channel A Rank 3 signals. Additionally, the original ZQ2 terminal at location G11 is de-functionalized.

In an embodiment, the CKE2_A, CKE3_A, CS2_A, and CS3_A terminals are reserved for a 4-rank package. For a 1-rank and 2-rank package, those terminals are de-functionalized (e.g NC, or depopulated). The die pad VSS and VSSQ signals may also be combined to VSS package terminals. In a 4 rank byte mode configuration where ZQ is per byte, the host can send ZQ calibration commands to rank 0/1 in parallel or ranks 2/3 in parallel similar to how multi-channel packages can send to CHA and CHB in parallel.

In accordance with embodiments, the memory packages 300 may including terminal arrangements for mounting on opposite sides of the circuit board. In an embodiment, the second terminal section 320 is a substantial mirror image of the first terminal section, less the first signal terminals (i.e. the second signal terminals corresponding to Channel B have been de-functionalized). The second terminal section 310 may also include a clock enable terminal (CKE3_A) and chip select terminal (CS3_A) that are not included in the first terminal section 310.

In the embodiment illustrated, the terminals 304B previously corresponding to the signal (e.g. channel select) terminals for Channel B, now within second section 320, have been electrically de-functionalized. For example, the terminals 304B may be depopulated, or disconnected. Depopulated terminals 304B may be nonexistent, while disconnected terminals 304B may have pads that are electrically disconnected. Terminals DNU may be de-functionalized (e.g. dummy terminals) and may be populated with solder balls for mechanical function. In an embodiment, package 300 of FIG. 4B may have 200 solder balls 104.

Figure 5:
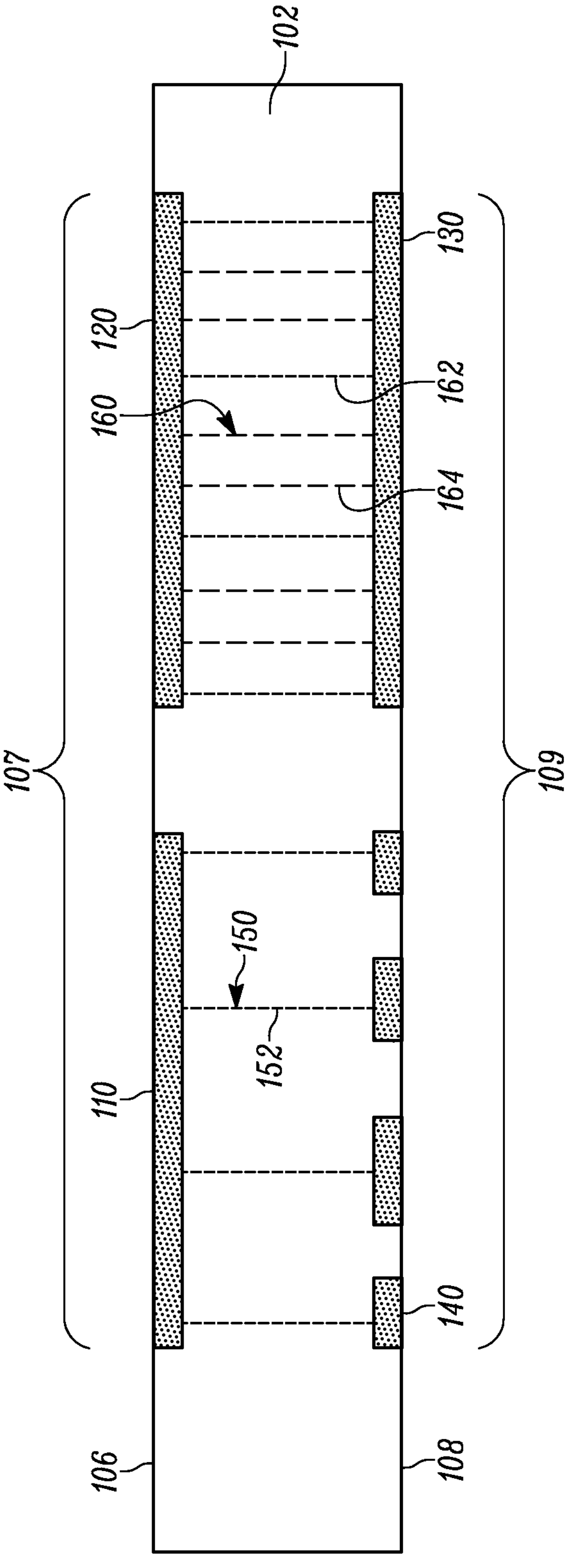
FIG. 5 is a close-up schematic cross-sectional side view illustration of a circuit board in accordance with an embodiment.

In accordance with embodiments, circuit boards are described which may be compatible with both conventional package layouts (e.g. conventional 8 GB LPDDR4 packages) as well as higher memory density layouts utilizing the memory packages described herein. Referring now to FIG. 5 a close-up schematic cross-sectional side view illustration is provided of a circuit board 102 in accordance with an embodiment. Specifically, the close-up illustration provides landing pad and interconnect arrangements for a section of the circuit board 102 which may receive a pair of memory packages 300, each mounted on an opposite side of the circuit board 102. Thus, the landing pad arrangements and interconnection arrangements may be repeated across the circuit board 102 for all locations capable of receiving dual side mounted memory packages 300 of FIG. 2, or alternatively, single side mounted memory packages 200 of FIG. 1. More specifically, the first (e.g. top) side 106 of the circuit board 102 may be designed to accept either memory packages 200 (e.g. 200 ball) or memory packages 300 (e.g. 166 ball, 200 ball), while the second (e.g. back) side 108 is designed to accept memory packages 300.

In accordance with embodiments, a circuit board 102 may include a first side 106 including a first package landing area 107 with first landing pad section 110 and second landing pad section 120, and a second side 108 opposite the first side 106 including a third landing pad section 130 opposite the second landing pad section 120 and a fourth landing pad section 140 opposite the first landing pad section 110. A first plurality of interconnects 150 (e.g. power interconnects 152) electrically connect power landing pads contained in the first landing pad section 110 and the fourth landing pad section 140, and a second plurality of interconnects 160 (e.g. power interconnects 162 and signal interconnects 164) electrically connect both power landing pads and signal landing pads contained in the second landing pad 120 section and the third landing pad section 130.

The circuit board 102 in accordance with embodiments may include additional distinguishing figures. For example, there may be a greater number of the second plurality of interconnects 160 than the first plurality of interconnects 150. This may be attributed to the de-functionalized second section 320 of a memory package 300 that may be mounted on the second side 108 of the circuit board, and aligned with the fourth landing pad section 140. Consequently, the fourth landing pad section 140 may include fewer signal landing pads than each of the first, section, and third land pad sections 110, 120, 130, respectively. The fourth landing pad section may include dummy landing pads, which can be provided in place of depopulated signal landing pads to accommodate dummy solder balls 104D. In an embodiment, the third landing pad section 130 may be a substantial mirror image of the first landing pad section 110.

In accordance with embodiments, the circuit board 102 is designed to accommodate the refactored packages 300, in which the number of banks controlled by the first and third landing pad sections 110, 130 is greater than those controlled by the second and fourth landing pad sections 120, 140. Thus, the number of data interfaces or landing pads can be reduced in at least the fourth landing pad section 140. Yet, the number of landing pads within the second landing pad section 120 can be retained in order to also accommodate packages 200, as shown in FIG. 1.

Figure 6A:
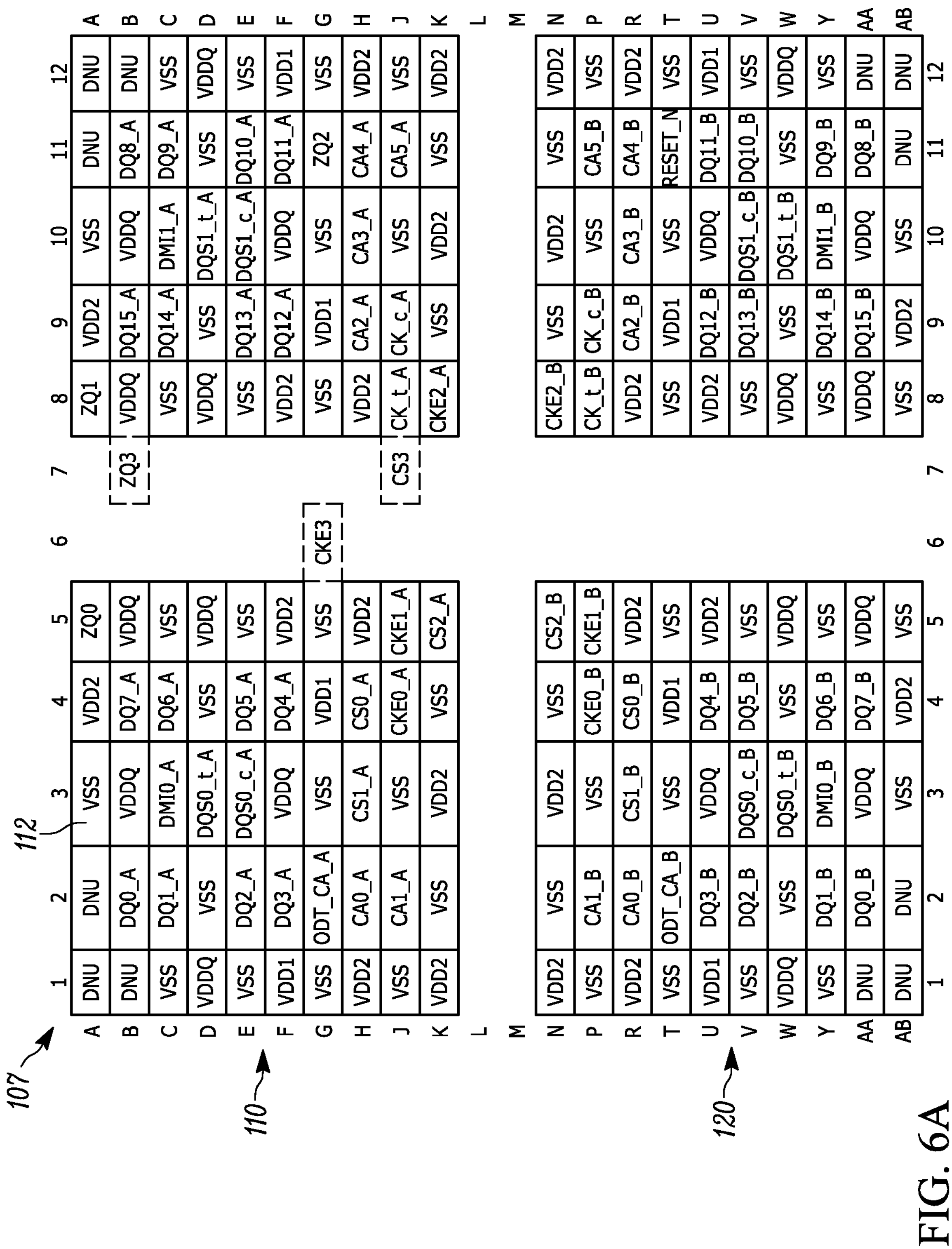
FIG. 6A is a schematic illustration of a package area landing pad layout for a first side of a circuit board in accordance with an embodiment.

FIG. 6A is a schematic illustration of a first package landing area 107 layout for a first side 106 of a circuit board 102 in accordance with an embodiment. FIG. 6B is a schematic illustration of a second package landing area 109 layout for a second side 108 of a circuit board 102 in accordance with an embodiment. Both FIGS. 6A and 6B are from the perspective as viewed from above the first side 106 of the circuit board. As shown, the first package landing area 107 includes the first landing pad section 110 and second landing pad section 120, while the second package landing area 109 includes the fourth landing pad section 140 and third landing pad section 130. The first and second landing pad sections 110, 120 may include landing pads 112 corresponding to the terminals included in the first section 310 and second section 320 illustrated in FIG. 4A, with the inclusion of the added terminals 304 and also including the de-functionalized terminals 304B. Thus, the first package landing area 107 can accommodate the terminal layouts for both the single channel packages 300 as well as the dual channel packages 200.

Referring now to FIG. 6B, the second package landing area 109 includes a fourth landing pad section 140 including landing pads 112 that correspond to the terminals 304 within the second section 320 of package 300, while the third landing pad section 130 includes landing pads 112 that correspond to the terminals 304 within the first section 310 of package 300. When compared to FIG. 6A, the fourth landing pad section 140 matches the first landing pad section 110, less the first signal landing pads (e.g. CA, CK, CKE, CS, DQ, DQS), and the additional clock enable landing pad (CKE3), chip select landing pad (CS3), and calibration landing pad (ZQ3). Furthermore, several landing pads (e.g. VSS, VSS, RESET_N) have different functions than those illustrated in FIG. 6A. In one embodiment, these specific landing pads can be re-routed to a different location (e.g. interstitial landing pad location). The fourth and third landing pad sections 140, 130 may include landing pads 112 (and optionally dummy landing pads 112B) corresponding to the terminals included in the first section 310 and second section 320 illustrated in FIG. 4A.

Similarly, the third landing pad section 130 matches the second landing pad section 120, with the addition of the additional clock enable landing pad (CKE3), chip select landing pad (CS3), and calibration landing pad (ZQ3). Furthermore, several landing pads (e.g. ZQ0, ZQ1, ZQ2) have different functions than those illustrated in FIG. 6A.

Figure 6C:
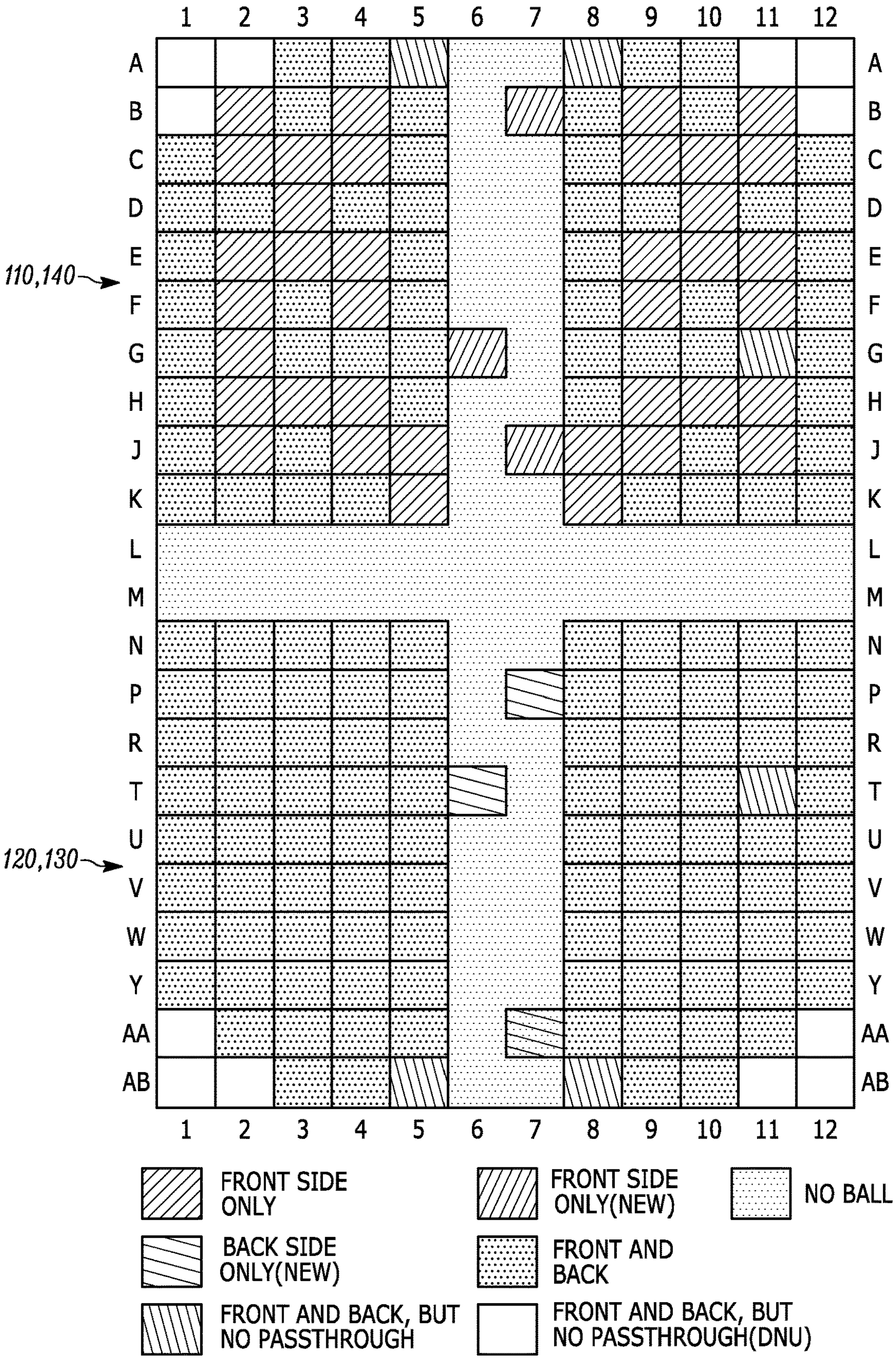
FIG. 6C is a composite illustration of the package area landing pad layouts of FIGS. 6A-6B in accordance with an embodiment.

FIG. 6C is a composite illustration of the package landing areas 107, 109 of FIGS. 6A-6B in accordance with an embodiment. Specifically, package landing area 107 is superimposed directly over package landing area 109. Specific landing pads are illustrated as being front side only, front side only (NEW) or additional landing pads added to the front side of the circuit board, back side only, front and back (e.g. electrically connected with an interconnect 150, 160), front and back, but no passthrough (no interconnect), front and back, but no passthrough (do not use), and no ball (or not landing pad). As shown in FIG. 6C, a larger number of landing pads in sections 120, 130 are electrically connected with interconnects 160 than landing pads within sections 110, 140 are electrically connected with interconnects 150.

Figure 7B:
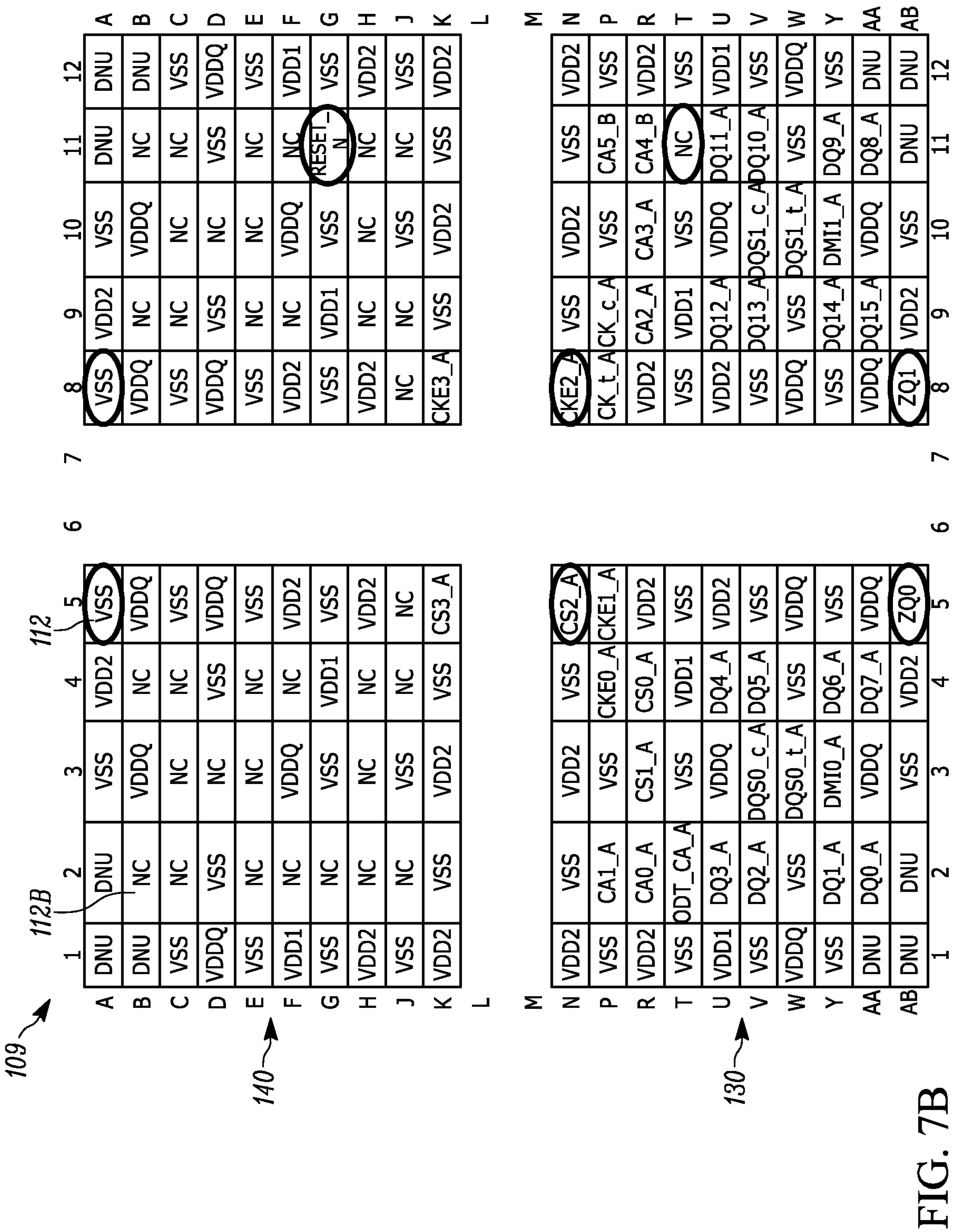
FIG. 7B is a schematic illustration of a package area landing pad layout for a second side of a circuit board in accordance with an embodiment.

FIG. 7A is a schematic illustration of a first package landing area 107 layout for a first side 106 of a circuit board 102 in accordance with an embodiment. FIG. 7B is a schematic illustration of a second package landing area 109 layout for a second side 108 of a circuit board 102 in accordance with an embodiment. Both FIGS. 7A and 7B are from the perspective as viewed from above the first side 106 of the circuit board similar to FIGS. 6A and 6B. As shown, the first and second landing pad sections 110, 120 may include landing pads 112 corresponding to the terminals included in the first section 310 and second section 320 illustrated in FIG. 4B, without the inclusion of the added terminals 304 and also including the de-functionalized terminals 304B. Thus, the first package landing area 107 can accommodate the terminal layouts for both the single channel packages 300 as well as the dual channel packages 200.

Referring now to FIG. 7B, the second package landing area 109 includes a fourth landing pad section 140 including landing pads 112 that correspond to the terminals 304 within the second section 320 of package 300, while the third landing pad section 130 includes landing pads 112 that correspond to the terminals 304 within the first section 310 of package 300. When compared to FIG. 7A, the fourth landing pad section 140 matches the first landing pad section 110, with the exception of several landing pads now having different function (e.g. VSS, RESET_N) than those illustrated in FIG. 7A. Similarly, the third landing pad section 130 matches the second landing pad section 120, with the exception of several landing pads (e.g. ZQ0, ZQ1, ZQ2) having different functions than those illustrated in FIG. 7A.

The fourth and third landing pad sections 140, 130 may include landing pads 112 (and optionally dummy landing pads 112B) corresponding to the terminals included in the first section 310 and second section 320 illustrated in FIG. 4B.

Figure 7C:
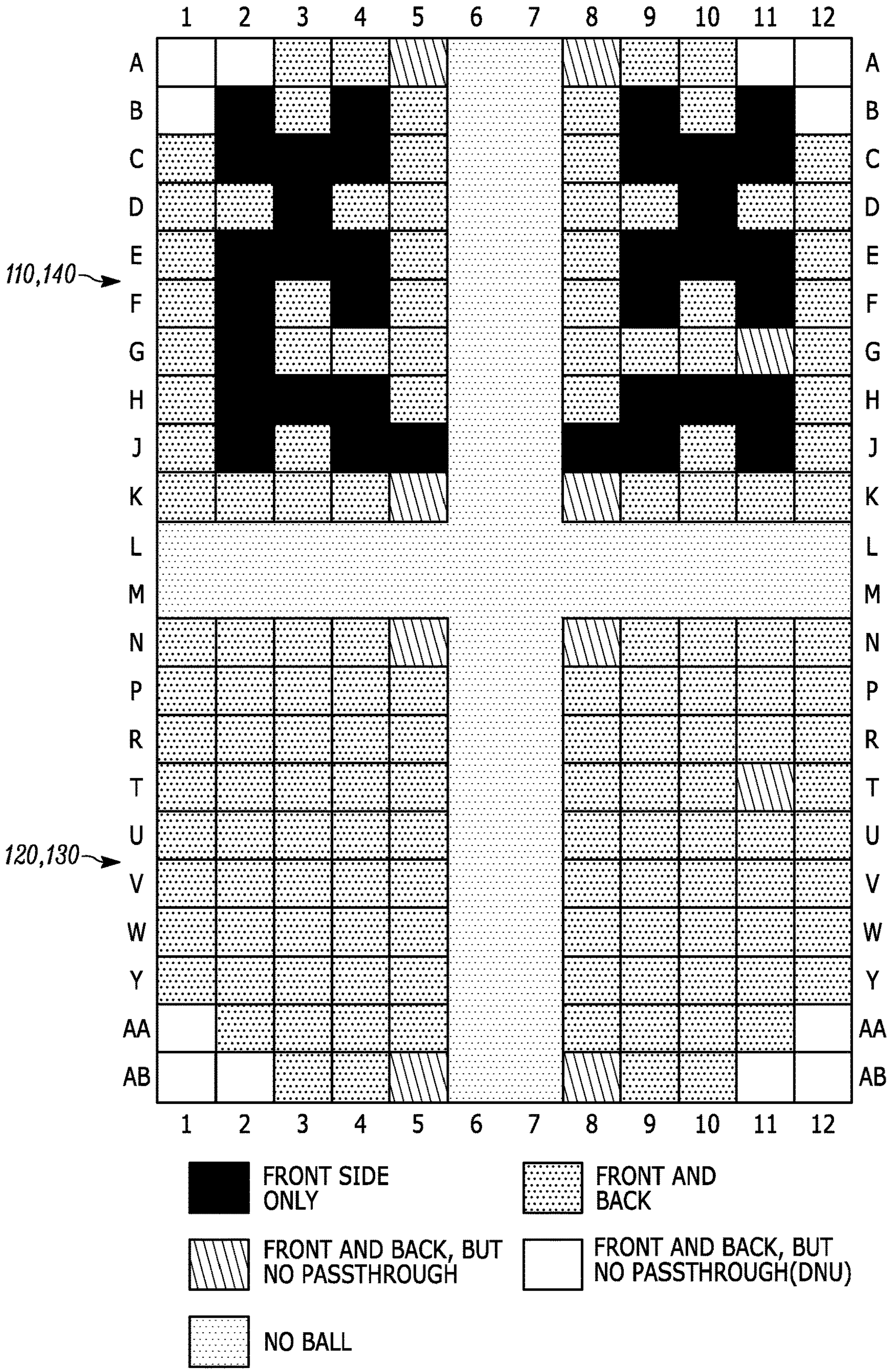
FIG. 7C is a composite illustration of the package area landing pad layouts of FIGS. 7A-7B in accordance with an embodiment.

FIG. 7C is a composite illustration of the package landing areas 107, 109 of FIGS. 7A-7B in accordance with an embodiment. Specifically, package landing area 107 is superimposed directly over package landing area 109, similarly as previously described with regard to FIG. 6C.

Figure 8B:
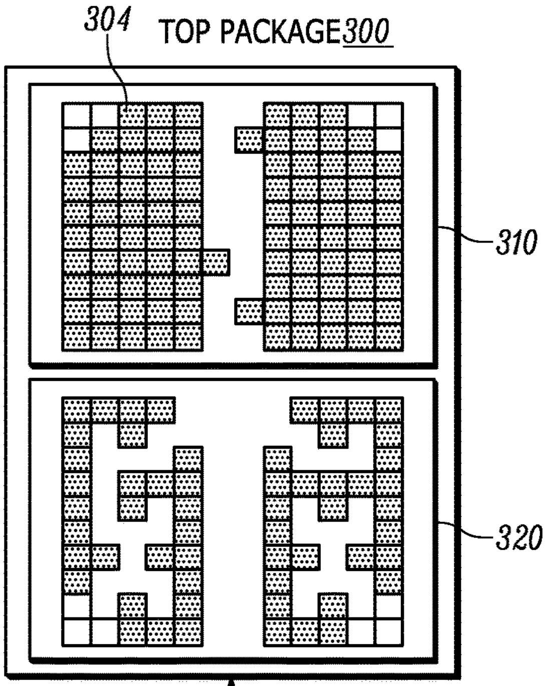
FIG. 8B is a schematic illustration of a terminal layout for the top memory package of FIG. 5A in accordance with an embodiment.
Figure 8C:
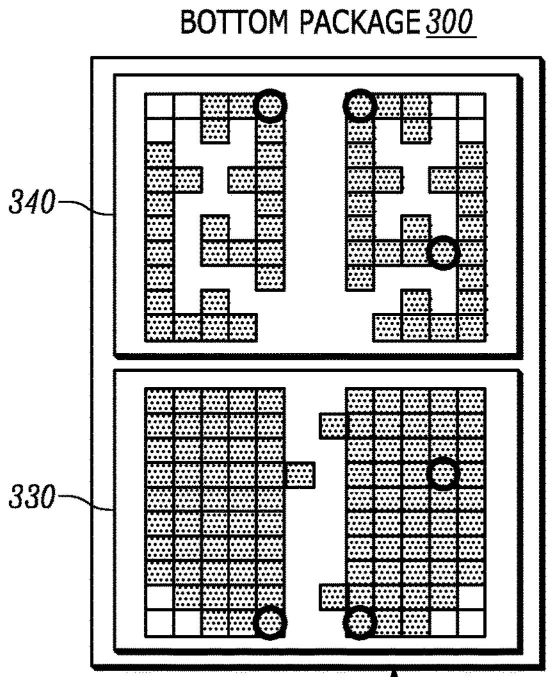
FIG. 8C is a schematic illustration of a terminal layout for the bottom memory package of FIG. 8A in accordance with an embodiment.
Figure 8A:
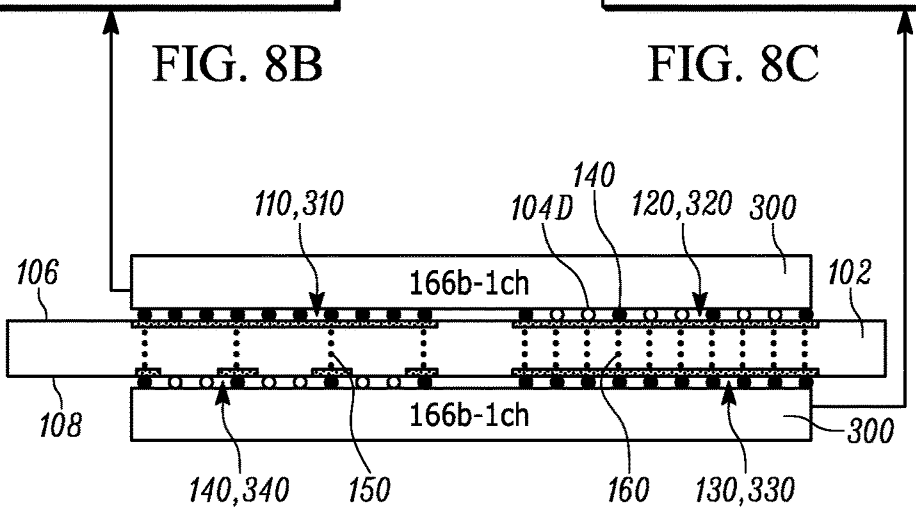
FIG. 8A is a schematic cross-sectional side view of a pair of single channel memory packages mounted on opposite sides of a circuit board in accordance with an embodiment.

FIG. 8A is a schematic cross-sectional side view of a pair of single channel memory packages 300 mounted on opposite sides of a circuit board 302 in accordance with an embodiment. For example, the circuit board 302 may have the pad layouts of FIGS. 6A-6C. FIG. 8B is a schematic illustration of a terminal layout for the top memory package 300 of FIG. 8A in accordance with an embodiment. FIG. 8C is a schematic illustration of a terminal layout for the bottom memory package 300 of FIG. 8A in accordance with an embodiment. The memory packages 300 of FIGS. 8B-8C may correspond to the memory package 300 of FIG. 4A in an embodiment.

Figure 9B:
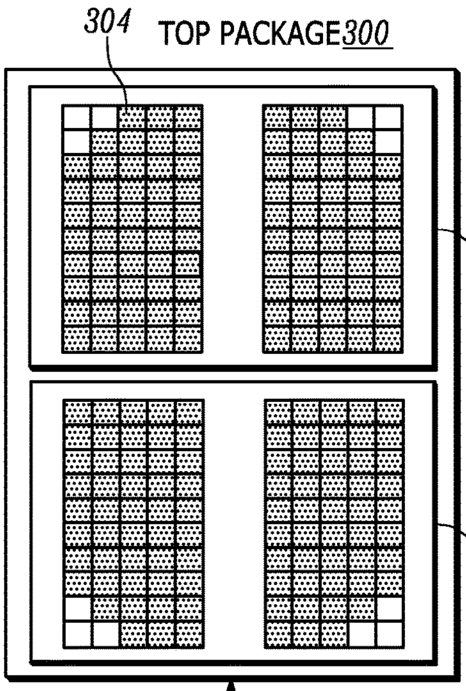
FIG. 9B is a schematic illustration of a terminal layout for the top memory package of FIG. 5A in accordance with an embodiment.
Figure 9C:
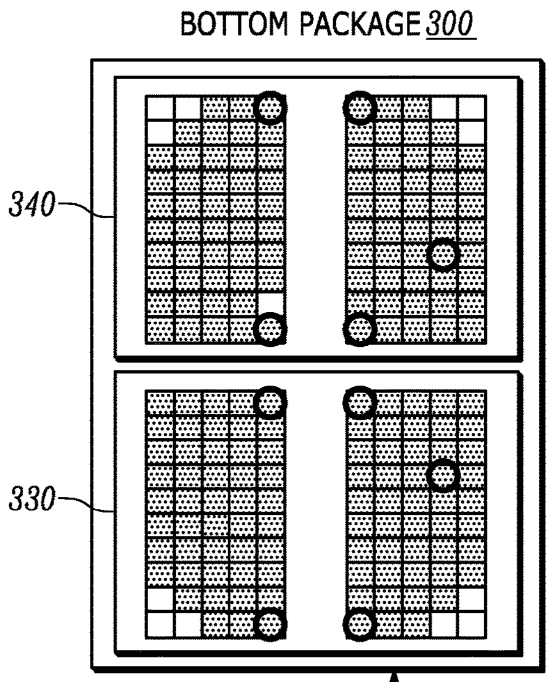
FIG. 9C is a schematic illustration of a terminal layout for the bottom memory package of FIG. 9A in accordance with an embodiment.
Figure 9A:
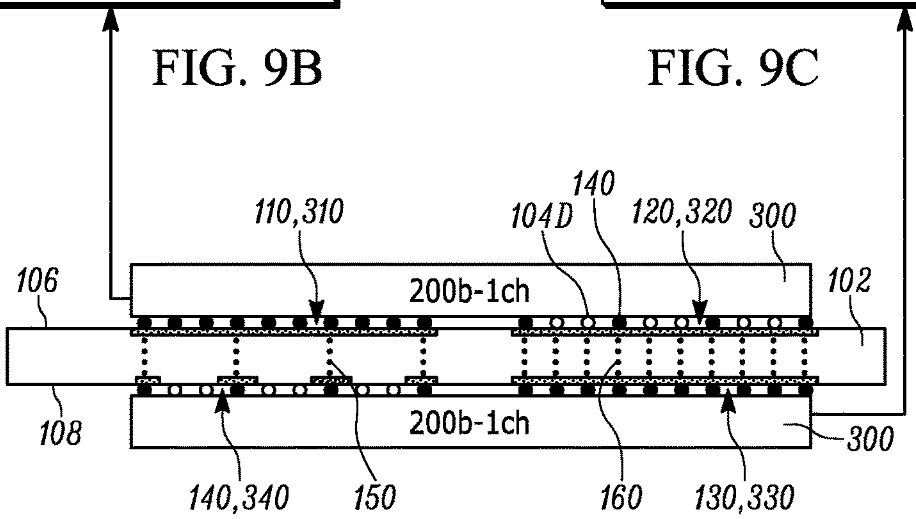
FIG. 9A is a schematic cross-sectional side view of a pair of single channel memory packages mounted on opposite sides of a circuit board in accordance with an embodiment.

FIG. 9A is a schematic cross-sectional side view of a pair of single channel memory packages 300 mounted on opposite sides of a circuit board 302 in accordance with an embodiment. For example, the circuit board 302 may have the pad layouts of FIGS. 7A-7C. FIG. 9B is a schematic illustration of a terminal layout for the top memory package 300 of FIG. 9A in accordance with an embodiment. FIG. 9C is a schematic illustration of a terminal layout for the bottom memory package 300 of FIG. 9A in accordance with an embodiment. The memory packages 300 of FIGS. 9B-9C may correspond to the memory package 300 of FIG. 4B in an embodiment.

Referring now to both FIGS. 8A-8C and 9A-9C, in accordance with embodiments, a memory module may include a circuit board 102 and a first memory package 300 mounted on a first (e.g. top) side 106 of the circuit board 102. The first memory package 300 may include a first terminal section 310 including first power terminals and first signal terminals to operate a first plurality of memory banks contained within the first memory package, and a second terminal section 320 including second power terminals to operate the first plurality of memory banks. A second memory package 300 is mounted on a second (e.g. bottom) side 108 of the circuit board 102 opposite the first side 106. The second memory package may include a third terminal section 330 including third power terminals and second signal terminals to operate a second plurality of memory banks contained within the second memory package, and a fourth terminal section 340 including fourth power terminals to operate the second plurality of memory banks. Generally, the number of memory banks controlled by the first and third terminal sections 310, 330 is greater than those controlled by the second and fourth terminal sections 320, 340, where bank control is otherwise moved to the corresponding terminal section of the opposing package. As shown in FIGS. 8A and 9A, the circuit board 102 includes an arrangement of interconnects (e.g. power interconnects 152, 162) that electrically connect the first power terminals with the fourth power terminals (e.g. VDD, VSS), and electrically connect the second power terminals with the third power terminals (e.g. VDD, VSS). Additionally, signal interconnects 164 may electrically connect the second signal terminals with the third signal terminals (e.g. CA, CK, CKE, CS, DQ, DQS).

In accordance with embodiments, the memory module may include a plurality of unused landing pads within the second landing pad section 120. For example, the unused landing pads may be unpopulated, or populated with dummy solder balls 104D. As shown in FIGS. 8A and 9A, the first terminal section 310 is bonded to the first landing pad section 110 on the first (e.g. front) side 106 of the circuit bard, and the second terminal section 320 is bonded to a second landing pad section 120 on the first side 106 of the circuit board 102. The third terminal section 330 is bonded to the third landing pad section 130 on the second side 108 of the circuit board 102, and the fourth terminal section 340 is bonded to the fourth landing pad section 140 on the second side 108 of the circuit board 102.

Figure 8D:
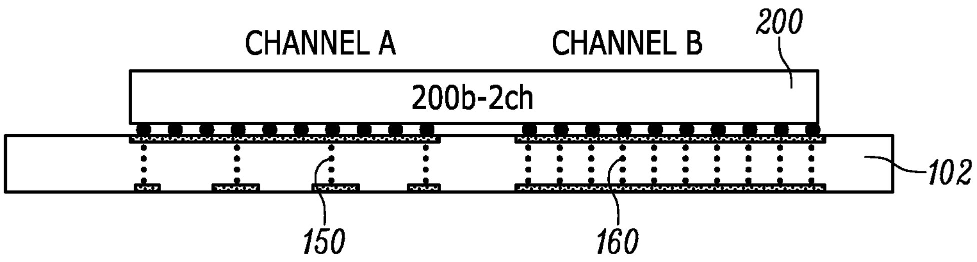
FIG. 8D is a schematic cross-sectional side view of a dual channel memory package mounted on top side of the circuit board of FIG. 8A in accordance with an embodiment.
Figure 9D:
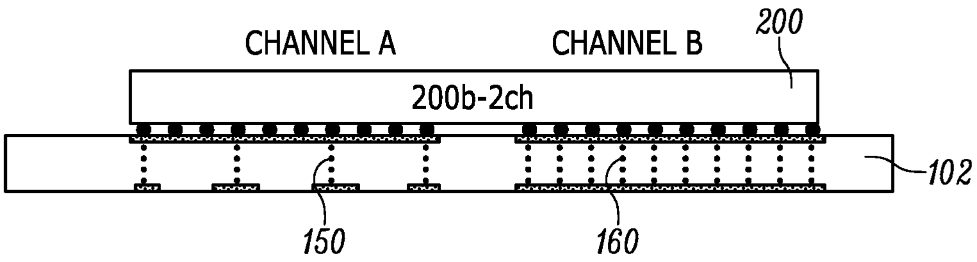
FIG. 9D is a schematic cross-sectional side view of a dual channel memory package mounted on top side of the circuit board of FIG. 9A in accordance with an embodiment.

In an embodiment, the second landing pad section 120 includes more landing pads 112 than the second terminal section 320 includes electrically functional terminals 304. For example, as shown in FIGS. 1, 8D and 9D, the second landing pad section 120 may include second signal pads (e.g. CA, CK, CKE, CS, DQ, DQS) and second power pads (e.g. VDD, VSS) to accommodate memory packages 200, while the second terminal section 320 of package 300 illustrated in FIGS. 4A-4B and 8A, 9A only includes second power terminals (e.g. VDD, VSS). As a result, the second signal pads within the second landing pad section 120 are not operably coupled with the second terminal section 320 of the first package 300. In an embodiment, the second signal pads are unpopulated. In an embodiment, the second signal pads are populated with dummy solder balls 104D. Meanwhile, the third landing pad section 130 includes third signal pads and third power pads to accommodate third signal terminals (e.g. CA, CK, CKE, CS, DQ, DQS) and third power terminals (e.g. VDD, VSS) of the third terminal section 330. The plurality of signal interconnects 164 electrically connect the second signal pads with the third signal pads, and the plurality of power interconnects 162 electrically connect the second power pads with the third power pads.

In an embodiment, the third landing pad section 130 includes more electrically functional landing pads 112 than the fourth landing pad section 140. For example, the fourth landing pad section 140 may include dummy landing pads 112B to mechanically accommodate dummy solder balls 104D, or landing pads 112 may not be present corresponding to depopulated terminals of the bottom package 300. The plurality of power interconnects 152 electrically connect the fourth power pads with the first power pads.

In accordance with embodiments, the circuit board layouts may be integrated into existing manufacturing processes, while increasing flexibility of manufacturing processes to support memory scaling, and more specifically scalability to 64 GB. In a specific embodiment, a memory module 100 includes a circuit board 102 and four first packages 300 mounted on a first side 106 of the circuit board 102. Each first package 300 includes a separate single channel and four ranks. Four second packages 300 are mounted on a second side 108 of the circuit board 102 directly opposite the four first packages 300. Each second package 300 also includes a separate single channel and four ranks. The circuit board 102 further includes four package area interconnects 150, 160 electrically connecting the four first packages to the four second packages, each of the package area interconnects comprising a first plurality of interconnects 150 (e.g. power interconnects 152) electrically connecting power landing pads on the first side 106 of the circuit board 102 to power landing pads on the second side 108 of the circuit board 102, and a second plurality of interconnects 160 (e.g. power interconnects 162 and signal interconnects 164) electrically connecting power and signal landing pads on the first side 106 of the circuit board 102 to power and signal landing pads on the second side 108 of the circuit board 102. The number of second plurality of interconnects 160 may be greater than the number of first plurality of interconnects 150.

In a specific embodiment, each package 300 includes 8 GB of memory. Each package 300 may include eight 8 Gb die 302, with two 8 Gb die 302 per rank. Each channel is a 16 bit channel in an embodiment.

In utilizing the various aspects of the embodiments, it would become apparent to one skilled in the art that combinations or variations of the above embodiments are possible for forming dual-sided memory module with channels aligned in opposition. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A memory module comprising:

a circuit board comprising:

- a first side including a first package landing area including a first landing pad section and a second landing pad section;
- a second side opposite the first side, the second side including a second package landing area including a third landing pad section opposite the second landing pad section and a fourth landing pad section opposite the first landing pad section;
- a first plurality of interconnects electrically connecting power landing pads contained in the first landing pad section and the fourth landing pad section; and
- a second plurality of interconnects electrically connecting power landing pads and signal landing pads contained in the second landing pad section and the third landing pad section;
- wherein a number of the second plurality of interconnects is greater than a number of the first plurality of interconnects, and the fourth landing pad section includes fewer signal landing pads than each of the first, second, and third landing pad section; and a first memory package mounted onto the first and second landing pad sections.

2. The memory module of claim 1, wherein the third landing pad section is a substantial mirror image of the first landing pad section.

3. The memory module of claim 1, wherein the first memory package comprises two ranks, a first channel electrically coupled with the first landing pad section, and a second channel electrically coupled with the second landing pad section.

4. The memory module of claim 1, wherein the first landing pad section comprises a plurality of landing pads that are not functionally connected with the first memory package.

5. The memory module of claim 4, wherein the plurality of landing pads comprises a calibration reference pad, a chip select pad, and a clock enable pad.

6. The memory module of claim 4, wherein the plurality of landing pads comprises a plurality of chip select pads, and a plurality of clock enable pads.

7. The memory module of claim 1, wherein a package is not bonded to the third landing pad section and the fourth landing pad section.

8. The memory module of claim 1, further comprising a second memory package mounted onto the third and fourth landing pad sections.

9. The memory module of claim 8, wherein each of the first and second memory packages each comprise less than 200 functionalized terminals.

10. The memory module of claim 8, further comprising a first group of solder bumps that connect the first package to the circuit board, and a second group of solder bumps that connect the second package to the circuit board.

11. The memory module of claim 10, wherein a majority of the first group of solder bumps is bonded to the second landing pad section, and a majority of the second group of solder bumps is bonded to the fourth landing pad section.

12. The memory module of claim 8, wherein the first memory package includes:

a first terminal section coupled with the first landing pad section, the first terminal section including first power terminals and first signal terminals to operate a first plurality of memory banks contained within the first memory package; and a second terminal section coupled with the second landing pad section, the second terminal section including second power terminals to operate the first plurality of memory banks.

13. The memory module of claim 12, wherein the second memory package includes:

a third terminal section coupled with the third landing pad section, the third terminal section including third power terminals and third signal terminals to operate a second plurality of memory banks contained within the second memory package; and a fourth terminal section coupled with the fourth landing pad section, the fourth terminal section including fourth power terminals to operate the first plurality of memory banks.

14. The memory module of claim 13, wherein a number of memory banks controlled by the first and third terminal sections is greater than a number of memory banks controlled by the second and fourth terminal sections.

15. The memory module of claim 8, wherein each of the first and second packages comprises a single channel at least four ranks.

16. The memory module of claim 15, wherein each of the first and second packages comprises an integer multiple of 8 GB of memory.

* * * * *